(12) United States Patent
Kuramoto

(10) Patent No.: US 11,125,645 B2
(45) Date of Patent: Sep. 21, 2021

(54) METHOD FOR MANUFACTURING OPTICAL MODULE

(71) Applicant: Mitsubishi Electric Corporation, Tokyo (JP)

(72) Inventor: Kyosuke Kuramoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/629,690

(22) PCT Filed: Sep. 12, 2017

(86) PCT No.: PCT/JP2017/032872
§ 371 (c)(1),
(2) Date: Jan. 9, 2020

(87) PCT Pub. No.: WO2019/053780
PCT Pub. Date: Mar. 21, 2019

(65) Prior Publication Data
US 2020/0333213 A1      Oct. 22, 2020

(51) Int. Cl.
*G01J 1/00*           (2006.01)
*G01M 11/02*      (2006.01)
*H01S 5/02253*   (2021.01)
*H01S 5/02326*   (2021.01)

(52) U.S. Cl.
CPC ..... *G01M 11/0221* (2013.01); *H01S 5/02253* (2021.01); *H01S 5/02326* (2021.01)

(58) Field of Classification Search
CPC .. B61L 5/1854; G03F 7/70641; G03F 9/7026; F21V 19/02; G01N 21/6452

USPC ......................................................... 356/123
See application file for complete search history.

(56) References Cited

U.S. PATENT DOCUMENTS

| 2011/0075887 A1 | 3/2011 | Tanaka |
| 2014/0286019 A1* | 9/2014 | Araki ................... F21V 14/003 362/311.09 |

FOREIGN PATENT DOCUMENTS

| CN | 1808199 A | 7/2006 |
| JP | S6381995 A | 4/1988 |
| JP | H01168090 A | 7/1989 |
| JP | H09252158 A | 9/1997 |
| JP | 2005300690 A | 10/2005 |
| JP | 2011075318 A | 4/2011 |
| JP | 2015200787 A | 11/2015 |
| JP | 2017139332 A | 8/2017 |
| TW | 202797 | 3/1993 |

OTHER PUBLICATIONS

ISRinternational Search Report; Written Opinion; and Notification of Transmittal of the International Search Report and the Written Opinion of the International Searching Authority, or the Declaration issued in PCT/JP2017/032872; dated Dec. 12, 2017.
(Continued)

*Primary Examiner* — Md M Rahman
(74) *Attorney, Agent, or Firm* — Studebaker & Brackett PC

(57) ABSTRACT

A laser device (3) emits laser light. A lens cap (4) covers the laser device (3). A lens (5) is built in the lens cap (4) and collects or collimates the laser light. A flat surface (7) perpendicular to an optical axis (6) of the laser light is provided in an upper surface of the lens (5).

11 Claims, 5 Drawing Sheets

(56) References Cited

OTHER PUBLICATIONS

Office Action issued in TW 106142355; mailed by the Taiwanese Patent Office dated Jun. 11, 2018.
Office Action issued in JP 2018-506239; mailed by the Japanese Patent Office dated Mar. 13, 2018.

\* cited by examiner

METHOD FOR MANUFACTURING OPTICAL MODULE

FIELD

The present invention relates to an optical module in which a laser device is covered with a lens cap incorporating a lens, and a method for manufacturing the same.

BACKGROUND

When a lens for collecting or collimating laser light is to be installed on a package in which a laser device such as a semiconductor laser is implemented, there is a method of directly implementing the lens on the package, a method of covering the laser device with a lens cap incorporating a lens, or the like (for example, see Patent Literature 1). It is important in this case to make an optical axis serving as the center of laser light coincide with the center position of the lens in order to reduce the spreading angle of a beam and to emit the beam straight.

Therefore, as the method of covering the laser device with the lens cap incorporating a lens, there is a method called active alignment in which a lens is tentatively installed while a laser device is caused to emit light, is finely moved with the spreading and the inclination of an emission pattern from the lens being observed and the lens is fixed at the optimum position. This however needs a complex manufacturing apparatus since the laser device is caused to emit light. Furthermore, the manufacturing takes much time since the observation of the emission pattern and the motion of the lens position need to be alternately repeated.

As a method for preventing this, one can come up with the following method. First, the end face of a laser is irradiated perpendicularly with light, and the light emission point position is recognized from reflected light. Next, light is radiated onto the upper surface of a lens, and from its reflected light, the center position of the lens is observed. Then, by moving a lens cap rightward and leftward, the light emission point position and the center position of the lens are made coincide with each other.

CITATION LIST

Patent Literature

[PTL 1] JP 2011-075318 A

SUMMARY

Technical Problem

The upper surface of a lens has a continuously changing convex-curved shape. Accordingly, light radiated except at the lens center is reflected outward although light radiated at the tens center is perpendicularly reflected. As a result, the intensity of the reflected light is strongest at the lens center part and becomes weaker as going more apart from the lens center part. Since the upper surface shape of the lens continuously changes, a reflected light intensity distribution continuously changes. It is needed to obtain a bright part and a dark part with a specific intensity in this reflection intensity distribution being as a threshold and to recognize the center position of the circular bright part as the lens center position.

The shape of the bright part however tends not to be a fine circular shape but to be a distorted shape due to the roughness of the lens surface, the angular deviation of the lens, or the like. Therefore, there has been a case where the lens center position cannot be correctly recognized and assembly is performed in the state where the light emission point center and the lens center do not coincide with each other. In this case, laser light having passed through the lens causes large spreading of a beam and/or deviation of the emission direction of the beam, which results in significant deterioration in system characteristics.

The present invention is devised in order to solve the problems as above, and an object thereof is to obtain an optical module capable of reducing displacement between a light emission point position and a lens center position, and a method for manufacturing the same.

Solution to Problem

An optical module according to the present invention includes: a laser device emitting laser light; a lens cap covering the laser device; and a lens built in the lens cap and collecting or collimating the laser light, wherein a flat surface perpendicular to an optical axis of the laser light is provided in an upper surface of the lens.

Advantageous Effects of Invention

In the present invention, a flat surface perpendicular to an optical axis of the laser light is provided in an upper surface of the lens. When recognition light is radiated toward the upper surface of the lens, the reflected light from the flat surface enters the camera at the center position thereof evenly with an identical strength. Meanwhile, the reflected light from beyond the flat surface enters the camera at positions off the center thereof. Thereby, the brightness of the circular bright spot recognized with the reflection from the flat surface by the camera and the brightness of its surrounding region are discontinuous therebetween. Accordingly, since the bright spot is clearly projected on the camera, the center of the lens can be recognized as the center of the bright spot with excellent accuracy. Thereby, displacement between the light emission point position of the laser device and the center position of the lens can be reduced.

DESCRIPTION OF EMBODIMENTS

An optical module and a method for manufacturing the same according to the embodiments of the present invention will be described with reference to the drawings. The same components will be denoted by the same symbols, and the repeated description thereof may be omitted.

Embodiment 1

Figure 1:
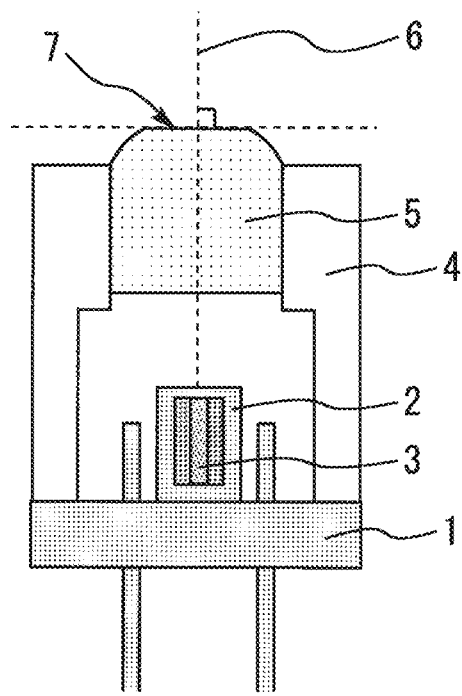
FIG. 1 is a sectional view showing an optical module according to Embodiment 1.

FIG. 1 is a sectional view showing an optical module according to Embodiment 1. A submount 2 is provided on a package 1, and a laser device 3 is provided on the submount 2. The laser device 3 emits laser light. The laser device 3 is covered with a lens cap 4. A lens 5 which collects or collimates the laser light is built in the lens cap 4. When this cap with the built-in lens is formed, a lens material is put in the lens cap 4 to be heated to a high temperature, and the softened lens material is pressed with molds from the upper side and the lower side to obtain the lens 5 in a desired shape. A flat surface 7 perpendicular to an optical axis 6 of the laser light is provided in the upper surface of the lens 5.

Figure 2:
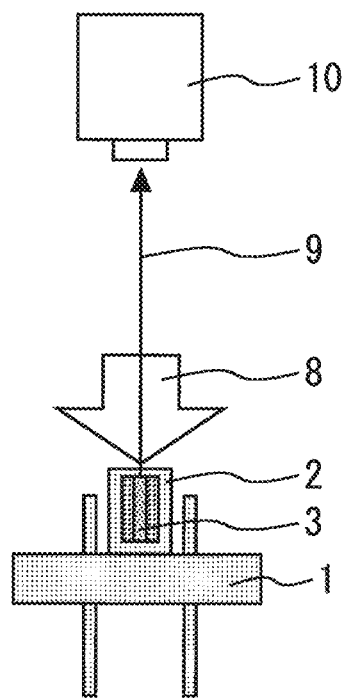
FIG. 2 is a sectional view showing a method for manufacturing of the optical module according to Embodiment 1.
Figure 3:
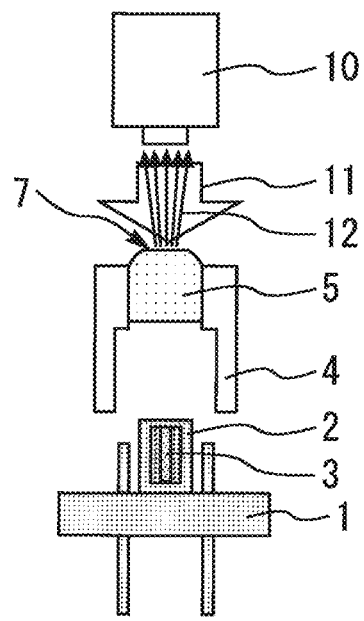
FIG. 3 is a sectional view showing a method for manufacturing of the optical module according to Embodiment 1.

FIG. 2 and FIG. 3 are sectional views showing a method for manufacturing of the optical module according to Embodiment 1. First, as shown in FIG. 2, the emission end face of the laser device 3 is irradiated perpendicularly with recognition light 8, and reflected light 9 thereof is captured by a camera 10. Then, since reflection of the reflected light occurs most strongly on the emission end face portion of the laser device 3, the camera 10 can recognize the end ace shape of the laser device 3. When the end face shape of the laser device 3 is found out, it can be found out where the light emission point position is.

Next, as shown in FIG. 3, recognition light 11 is radiated toward the upper surface of the lens 5 built in the lens cap 4, and from the shape of its reflected light 12, the center position of the lens 5 is recognized. Since a vertex portion of the lens 5 is the flat surface 7 perpendicular to the recognition light 11, the reflected light 12 from this flat surface 7 enters the camera 10 at the center position thereof evenly with an identical strength. Meanwhile, the reflected light 12 from other than the flat surface 7 enters the camera 10 at positions off the center thereof. Thereby, the brightness of the circular bright spot recognized with the reflection from the flat surface 7 by the camera 10 and the brightness of its surrounding region are discontinuous therebetween. Accordingly, since the bright spot is clearly projected on the camera 10, the center of the lens 5 can be recognized as the center of the bright spot with excellent accuracy.

Then, by moving the lens cap 4 rightward and leftward, the light emission point position of the laser device 3 and the center position of the lens 5 are made coincide with each other. The lens cap 4 is welded to the package 1 at the positions. Thereby displacement between the light emission point position of the laser device 3 and the center position of the lens 5 can be reduced. As a result, there can be obtained an optical module small in spreading of a beam and in deviation of the emission direction of the beam.

Figure 4:
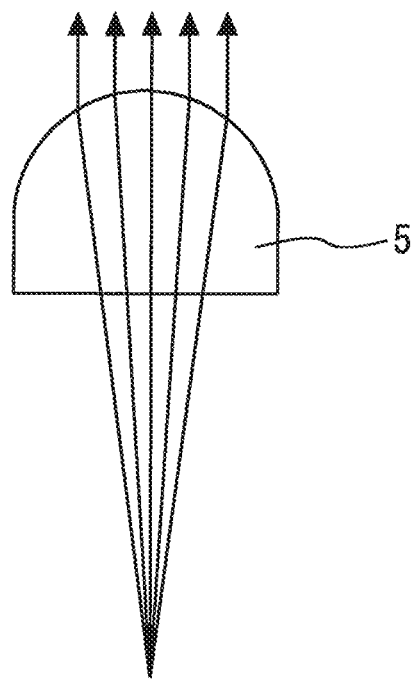
FIG. 4 is a diagram showing the shape of a collimation lens according to a comparative example and optical paths of laser light.

FIG. 4 is a diagram showing the shape of a collimation lens according to a comparative example and optical paths of laser light. The upper surface of the lens 5 has a shape in which the laser light is parallelly emitted. Accordingly, when laser light emitted from the light emission point of the laser device 3 enters the lens 5 at any position thereon, the laser light is emitted from the upper surface of the lens 5 to be parallel to the optical axis.

Figure 5:
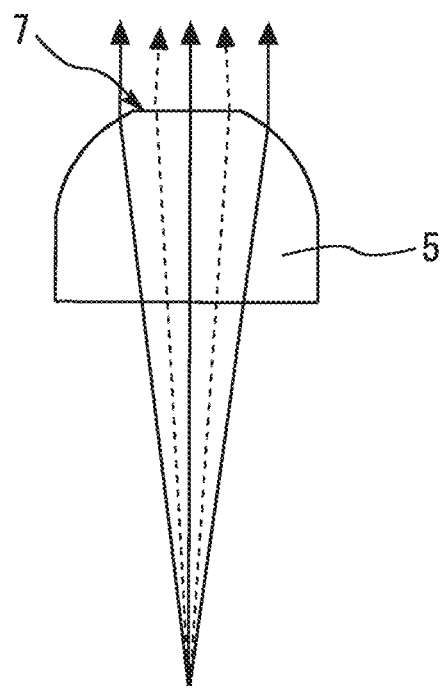
FIG. 5 is a diagram showing the shape of the lens according to Embodiment 1 and optical paths of laser light.

FIG. 5 is a diagram showing the shape of the lens according to Embodiment 1 and optical paths of laser light. As indicated by the solid lines, laser light that passes through the dead center position of the lens 5 and the region thereof beyond the flat surface 7 results in emitted light parallel to the optical axis. As indicated by the dotted lines, laser light that passes through the flat surface 7 except the dead center position of the lens 5 is however to be emitted with slight inclinations relative to the optical axis. Nevertheless, it is sufficient for the flat surface 7 of the lens 5 to have a dimension with which the resolution of the camera 10 is suitable for recognition thereof and an angular difference thereof from except the flat surface 7 can be sufficiently secured. This dimension is sufficiently about hundreds of micrometers. Meanwhile, spreading of the laser light on the upper surface of the lens 5 is not less than millimeters, and the influence of the flat surface 7 of the lens 5 is extremely small. Moreover, in the case of use for projectors, for example, since all the amount of light is taken into an integrator rod finally guiding the light when a parallelism relative to the optical axis is within plus or minus several degrees, slight angular deviation due to the flat surface 7 does not cause any problem.

For example, it is supposed that the distance between the light emission point center of the laser device 3 and the upper surface of the lens 5 is 3 mm, the radius of the flat surface 7 of the lens 5 is 0.12 mm, and the refractive index of the lens 5 is 1.8. In this case, a deviation angle θ, from the optical axis, of laser light that passes through the lens 5 at the outermost peripheral portion of the flat surface 7 is $\sin^{-1}(1/1.8 \times 0.12/3) = 1.06°$ from the Fresnel formulas.

Moreover, even in the case of collecting light or in the case where a stricter parallelism is required, desired characteristics can be obtained by designing of enlarging a focal distance and more reducing the size of the flat surface 7, or the similar designing.

Notably, while in the present embodiment, a case where the lens 5 is built in the lens cap 4 has been described, the same hold true for a separate, sole lens 5 which is not built in any lens cap 4. In this case, the lens 5 is to be solely moved to be fixed onto the package 1 with an adhesive agent or the like.

Embodiment 2

Figure 6:
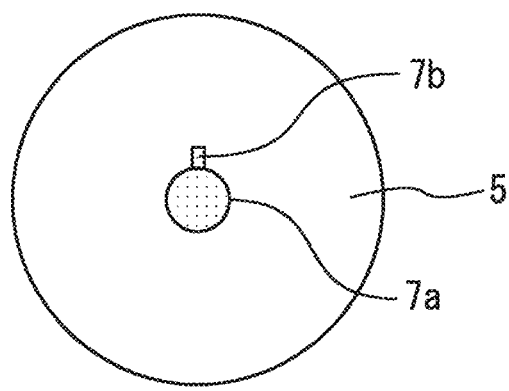
FIG. 6 is a top view showing a lens of an optical module according to Embodiment 2.

FIG. 6 is a top view showing a lens of an optical module according to Embodiment 2. This view is a view of the lens 5 as seen from the laser emission side. A flat surface 7a perpendicular to the optical axis of laser light is provided at the center position of the upper surface of the lens 5. A flat surface 7b is provided so as to be in contact with only a part of the periphery of the flat surface 7a. Accordingly, a shape having the flat surfaces 7a and 7b combined has anisotropy in a rotational direction with the center of the upper surface of the lens 5 being as a rotational center.

An assembly method of the lens cap is similar to that in Embodiment 1, and similarly to Embodiment 1, the center of the lens 5 can be recognized with excellent accuracy. Moreover, the rotational direction of the lens 5 can be easily specified by reflected light from the flat surfaces 7a and 7b. Notably, the flat surface may have any shape as long as, with it, the rotational direction of the lens 5 can be recognized. Even when the flat surface has an elliptic shape, for example, the rotational direction of the lens 5 can be specified.

The present embodiment is particularly effective when an asymmetric lens the planar shapes of which in the top-bottom direction and the right-left direction are different is used as the lens 5 in order to shape laser light. In this case, by relatively positioning the rotational direction of the lens 5 and the rotational direction of the laser device 3, there can be obtained a semiconductor laser small in spreading of a beam, and particularly, in deviation of the emission direction of the beam.

Embodiment 3

Figure 7:
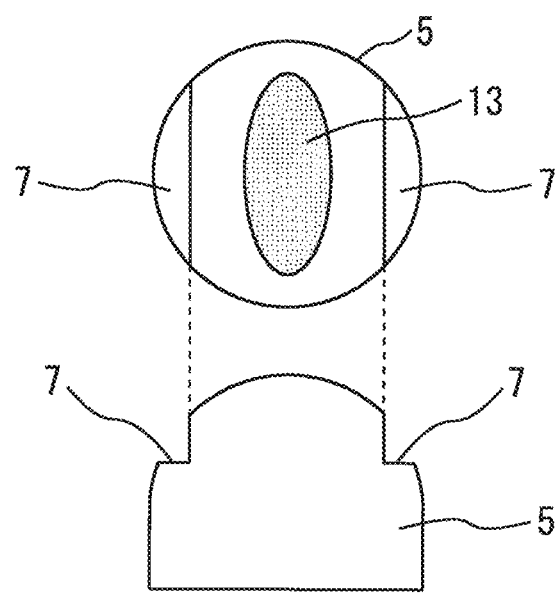
FIG. 7 shows a top view and a lateral view showing a lens of an optical module according to Embodiment 3.

FIG. 7 shows a top view and a lateral view showing a lens of an optical module according to Embodiment 3. When spreading angles of laser light in the vertical direction and the horizontal direction are different, a spot 13 of laser light that passes through the lens 5 at its upper surface position is elliptic. Regions which laser light substantially does not pass through exist on both sides of the elliptic spot 13 in the upper surface of the lens 5. Each flat surface 7 perpendicular to the optical axis of laser light is provided in each of the regions. Notably, not limited to this, such a flat surface 7 may be provided in a region, except the lens vertex, that laser light substantially does not pass through. The flat surface 7 has a shape obtained by cutting off a curved surface of the periphery of the lens 5.

An assembly method of the lens cap is similar to that in Embodiment 1. Recognition light radiated onto the lens 5 is intensely reflected on the flat surfaces 7, and the planar shapes of the flat surfaces 7 are recognized by the camera. The center position and the rotational direction of the lens 5 can be recognized from these shapes with excellent accuracy. These flat surfaces 7 being in the curved surface, on the lens 5, which has a lens effect, not beyond the lens 5, enables the center position and the rotational direction of the lens 5 to be recognized with further excellent accuracy.

Moreover, the lens cap 4 supports the periphery of the lens 5, and the lens 5 is exposed in a circular shape from the lens cap 4. Accordingly, the flat surfaces 7 are preferably inside the circular shape of the lens 5 in order that the flat surfaces 7 can be observed with the recognition light as the lens cap 4 is seen from the upper surface.

Figure 8:
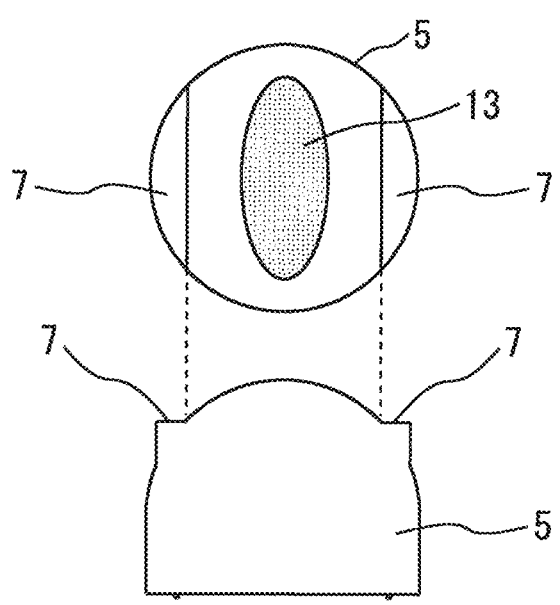
FIG. 8 shows a top view and a lateral view showing Modification 1 of the lens of the optical module according to Embodiment 3.

FIG. 8 shows a top view and a lateral view showing Modification 1 of the lens of the optical module according to Embodiment 3. In this modification, the flat surfaces 7 protrude from the curved surface of the periphery of the lens 5. The aforementioned effect can also be obtained in this case.

Figure 9:
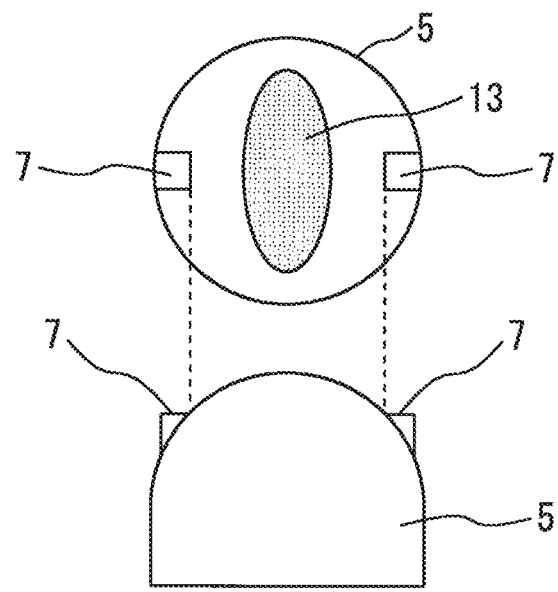
FIG. 9 shows a top view and a lateral view showing Modification 2 of the lens of the optical module according to Embodiment 3.

FIG. 9 shows a top view and a lateral view showing Modification 2 of the lens of the optical module according to Embodiment 3. In this modification, the flat surfaces 7 are narrower than the spot 13 in the longitudinal direction of the elliptic spot 13. Therefore, the center and the rotational direction of the lens 5 can be further easily recognized.

Notably, the flat surfaces 7 may have any shapes as long as the center and the rotational direction of the lens 5 can be recognized. For example, not limited to being rectangular, the flat surfaces 7 may have triangular shapes each of which is tapered toward the center of the lens 5. Thereby, the center and the rotational direction of the lens 5 can be further easily recognized.

Embodiment 4

Figure 10:
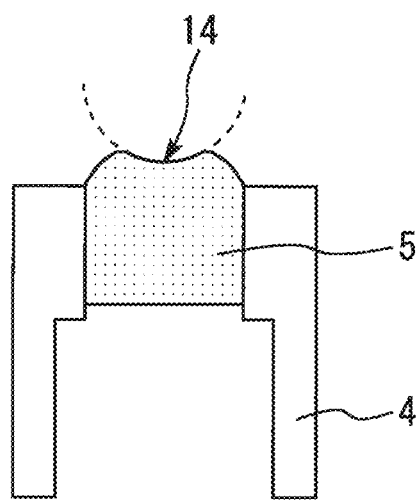
FIG. 10 is a sectional view showing a cap with a built-in lens of an optical module according to Embodiment 4.

FIG. 10 is a sectional view showing a cap with a built-in lens of an optical module according to Embodiment 4. A concave surface 14 is provided at the center position of the upper surface of the lens 5. The other configurations are similar to those in Embodiment 1, and an assembly method of the lens cap 4 is also similar to that in Embodiment 1. Recognition light radiated onto the lens 5 at its center is reflected on the upper surface of the lens 5. Reflected light from the concave surface 14 is then collected at the position of the camera 10, and a bright spot of the reflected light is recognized as a brighter and smaller spot. Thereby, the center position of the lens 5 can be further easily recognized.

REFERENCE SIGNS LIST

3 laser device; 4 lens cap; 5 lens; 7,7a,7b flat surface; 11 recognition light; 12 reflected light; 14, concave surface

The invention claimed is:

1. A method for manufacturing an optical module which includes a laser device emitting laser light, a lens cap covering the laser device, and a lens built in the lens cap and collecting or collimating the laser light, wherein a flat surface perpendicular to an optical axis of the laser light is provided in an upper surface of the lens, comprising:
   radiating recognition light onto the upper surface of the lens;
   recognizing a center position of the lens from a shape of reflected light; and
   aligning a light emission point of the laser device with the center position of the lens.

2. The method for manufacturing the optical module according to claim 1, wherein the flat surface is provided at a center position of the upper surface of the lens.

3. The method for manufacturing the optical module according to claim 1, wherein the flat surface is provided in a region which the laser light substantially does not pass through.

4. The method for manufacturing the optical module according to claim 1, wherein the radiating the recognition light onto the upper surface of the lens causes the recognition light to be reflected from the upper surface of the lens.

5. The method for manufacturing the optical module according to claim 1, wherein the recognition light is radiated from an upper side of the lens onto the upper surface of the lens.

6. A method for manufacturing an optical module which includes a laser device emitting laser light, a lens cap covering the laser device, and a lens built in the lens cap and collecting or collimating the laser light, wherein a flat surface perpendicular to an optical axis of the laser light is provided in an upper surface of the lens, comprising:
   radiating recognition light onto the upper surface of the lens;
   recognizing a center position of the lens from a shape of reflected light; and
   aligning a light emission point of the laser device with the center position of the lens, wherein a shape of the flat surface has anisotropy in a rotational direction with a center of the upper surface of the lens being as a rotational center.

7. The method for manufacturing the optical module according to claim 6, wherein the flat surface is provided at a center position of the upper surface of the lens.

8. The method for manufacturing the optical module according to claim 6, wherein the flat surface is provided in a region which the laser light substantially does not pass through.

9. A method for manufacturing an optical module which includes a laser device emitting laser light, a lens cap covering the laser device, and a lens built in the lens cap and collecting or collimating the laser light, wherein a concave surface is provided at a center position of an upper surface of the lens, comprising:
- radiating recognition light onto the upper surface of the lens;
- recognizing a center position of the lens from a shape of reflected light; and
- aligning a light emission point of the laser device with the center position of the lens.

10. The method for manufacturing the optical module according to claim 9, wherein the radiating the recognition light onto the upper surface of the lens causes the recognition light to be reflected from the upper surface of the lens.

11. The method for manufacturing the optical module according to claim 9, wherein the recognition light is radiated from an upper side of the lens onto the upper surface of the lens.

* * * * *